July 5, 1966 J. A. NARUD ETAL 3,259,761

INTEGRATED CIRCUIT LOGIC

Filed Feb. 13, 1964 2 Sheets-Sheet 1

INVENTORS
Jan A. Narud
Walter C. Seelbach
BY
Mueller & Aichele
ATT'YS.

July 5, 1966 J. A. NARUD ETAL 3,259,761

INTEGRATED CIRCUIT LOGIC

Filed Feb. 13, 1964 2 Sheets-Sheet 2

INVENTORS
Jan A. Narud
Walter C. Seelbach

BY Mueller & Aichele

ATT'YS.

United States Patent Office 3,259,761

Patented July 5, 1966

3,259,761

INTEGRATED CIRCUIT LOGIC

Jan A. Narud and Walter C. Seelbach, Scottsdale, Ariz., assignors to Motorola, Inc., Chicago, Ill., a corporation of Illinois Filed Feb. 13, 1964, Ser. No. 344,718
7 Claims. (Cl. 307—88.5)

This application is a continuation-in-part of our co-pending application Serial No. 273,033 filed April 15, 1963, now abandoned, and assigned to the present assignee.

The present invention relates to logic circuits and systems, and the like for use in electronic digital computers, and in other electronic apparatus; and it relates more particularly to improved logic circuits and systems which are particularly suited to integrated circuit construction.

Integrated ciruits involve the use of a substrate of semiconductor material, and the creation of diffused junctions in the substrate to constitute transistors, diodes, and the like. Other circuit elements, such as resistors, capacitors, and conductors are also formed on the substrate in accordance with known techniques.

The advent of integrated circuits requires a new conceptual approach to logic systems and circuitry; and the systems and circuitry of the invention are conceived to utilize the inherent advantages of integrated circuit construction and to compensate for any inherent disadvantages therein.

Certain limitations are encountered when it is attempted to construct logic circuitry in accordance with integrated circuit techniques. One such limitation is due to the parasitic coupling between various parts of the circuits through neighboring regions and through the substrate itself. Such parasitic coupling tends to reduce the operational speed of the circuitry, particularly if the impedance at the points where logical connections are made is relatively high.

It has also been found that integrated circuits are relatively sensitive to variations in component values with temperature. This is because the characteristics of the semiconductor components vary exponentially with temperature. Therefore, the transfer characteristics of an integrated circuit may change considerably with temperature, unless some form of compensation is provided.

Another limitation in integrated circuits is that the connections which furnish power to the particular circuit are usually miniaturized. This means that such connections are of relatively high resistance, and this tends towards poor regulation of the exciting voltages. It follows, therefore, that the integrated circuit components must be relatively insensitive to variations in the exciting voltage.

It is, accordingly an object of the invention to provide improved transistorized logic circuits, and the like, which require but one conductivity type of transistor, and which are particularly suited to fabrication as integrated circuit structures.

Another object of the invention is to provide such improved circuits and systems which are reliable in their operation and which are relatively insensitive to variations in the components due to environmental changes, or aging effects.

Another object of the invention is to provide such improved circuits and systems which are relatively insensitive to variations in exciting voltages.

Yet another object is to provide such improved circuits and systems in which the tolerance requirements of the individual circuit components may be relatively low.

A still further object of the invention is to provide such circuits which are conceived to overcome the limitations of integrated circuit construction and which have adequate logical capabilities for the performance of all the logical functions required, for example, in a present-day electronic digital computer.

Another object of the invention is to provide an improved logic circuitry and system by which the effects of parasitic coupling to ground, or to the substrate, are minimized when, for example, the system is of the integrated type.

Another object of the invention is to provide such improved logic circuits and systems in which the propagation time is extremely small, and in which power dissipation is kept at a minimum.

Another object of the invention is to provide such improved logic circuitry in which the noise immunity is sufficiently large so that noise signals appearing at the input of the circuit do not result in erroneous operation thereof.

Another object of the invention is to provide such an improved logic circuit in which the voltage deviation levels of the output are the same as of the input so as to permit coupling of like stages without the need for interposed voltage transposition circuits.

Yet another object is to provide such improved logic circuitry which exhibits relatively low output impedance for large fan-out capabilities.

A feature of the invention is the provision of a current mode switching circuit and emitter followers in the logic circuitry to achieve the desired characteristics of like voltage deviation levels in the output and input and low output impedance.

Another feature is the provision of degenerative feedback means in the switching circuit so that the tolerance requirements will be relatively low.

Yet another feature is the provision of voltage regulating means in the system to render the same relatively independent of variations in the power supply voltage.

Other features, advantages and objects of the invention will become apparent from a consideration of the following description when taken in conjunction with the accompanying drawings, in which.

As mentioned above, the integration of logic circuitry imposes some additional requirements peculiar to the technology involved. Firstly, there is a tendency towards parasitic coupling between the various parts of the circuits through neighboring regions and through the substrate. Secondly, certain ranges of component values cannot be readily attained by present-day integrated circuit technique. Finally, because components cannot be selected in an integrated circuit, the individual elements and component parameters must necessarily have much larger tolerances than their counterparts in the usual type of prior art circuits.

The construction of integrated logic circuitry is, therefore, a more difficult task than the design of its discrete component counterpart. The purpose of the present invention is to counteract and overcome such difficulties.

For instance, to counteract the effect of parasitic coupling to the substrate in integrated circuits, the circuit of the invention is constructed so the logical connections are made at points which have as low an impedance level with respect to ground or to the substrate as possible.

The logic circuitry of the invention also incorporates feedback or compensation so that it can tolerate the large tolerance limits normally required for integrated components.

In order to take full advantage of the space saving capability of the integrated circuit construction, the interconnection of the logic circuitry should be miniaturized. This means that connections furnishing power to the components of the circuit must necessarily have relatively high resistance which, as noted above, lowers the regulation of the power supply voltages. Therefore, the circuitry of the invention incorporates compensation means to overcome the effects of variations in power supply voltages, temperature, and the like.

Figure 1:
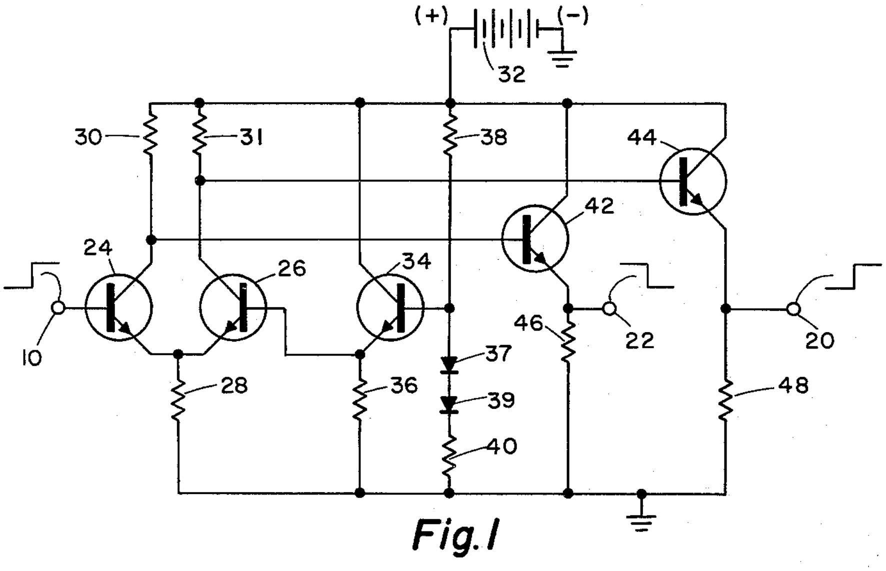
FIGURE 1 is a transistorized logic current switching circuit constructed to incorporate the concepts of the invention and which is particularly adapted to integrated circuit construction.

The transistorized logic current switching circuit of FIGURE 1 is constructed to incorporate the various features mentioned above, so as to enable it to be particularly suited for fabrication as an integrated circuit component.

The current switching circuit of FIGURE 1 includes a pair of NPN switching transistors designated 24 and 26 respectively. The emitters of the transistors 24 and 26 are connected to a common resistor 28 which, in turn, is connected to a point of reference potential, such as ground.

The collector of the transistor 24 is connected to a resistor 30 which, in turn, is connected to the positive terminal of a direct current exciting voltage source 32. The negative terminal of the source 32 is grounded, as shown. The collector of the transistor 26 is connected to a resistor 31, which likewise, is connected to the positive terminal of the source 32.

The input terminal 10 is connected to the base of the transistor 24. The base of the transistor 26, on the other hand, is connected to the emitter of a further NPN transistor 34, and to a grounded resistor 36. The collector of the transistor 34 is directly connected to the positive terminal of the source 32. The base of the transistor 34, on the other hand, is connected to a voltage divider including a pair of resistors 38 and 40 and a pair of silicon diodes 37 and 39. The diodes 37 and 39 provide temperature compensation for transistor 34. The values of these resistors and diodes are selected such that the potential on the base of transistor 26 is equal to the supply voltage $$V_C-\frac{V_L}{2}-V_T$$

where $V_L$ is the logic swing and $V_T$ is the offset voltage of transistor 34.

The collector of the transistor 24 is connected to the base of a further NPN transistor 42, and the collector of the transistor 26 is connected to the base of a further NPN transistor 44. The transistors 42 and 44 are connected as emitter followers. The collectors of these transistors are both connected directly to the positive terminal of the source 32. The emitter of the transistor 42 is connected to the output terminal 22 and to a grounded resistor 46. The emitter of the transistor 44, on the other hand, is connected to the output terminal 20 and to a grounded resistor 48.

As indicated in FIGURE 1, the input signal applied to the input terminal 10 is in the form of voltage transitions between two voltage levels. The base of the transistor 26 is biased by the circuitry of the transistor 34 to a level which is about half-way between the upper and lower voltage levels of the input signal. Therefore, when the input signal is at its lower voltage condition, the base of the transistor 26 is positive with respect to its emitter, so that the transistor 26 is conductive. The resulting current flow through the transistor 26 establishes a potential across the common emitter resistor 28 which is higher than the lower level of the input voltage, so that the transistor 24 is rendered non-conductive.

It follows, therefore, that so long as the input signal applied to the input terminal 10 is in its lower voltage condition, the transistor 24 is non-conductive, so that its collector potential approaches that of the source 32, and the transistor 26 is conductive, so that its collector potential is negative with respect to the positive terminal of the source 32.

On the other hand, when the input signal is at its high voltage level, the transistor 24 is rendered conductive, so that the potential of its collector is negative with respect to the positive terminal of the source 32. At the same time, the transitor 26 is rendered non-conductive, so that the potential of its collector approaches the potential of the positive terminal of the source 32.

The potential appearing at the collector of the transistor 24 is applied to the base of the emitter follower transistor 42, so that an output signal, 180° out of phase with the input signal, appears at the output terminal 22.

The signal appearing at the collector of the transistor 26 is introduced to the base of the emitter follower transistor 44, so that an output signal appears at the output terminal 20. This latter output signal is in phase with the input signal applied to the input terminal 10.

The emitter followers 42 and 44 serve to translate the voltages appearing at the collectors of the transistors 24 and 26 from relatively high voltage levels to lower voltage levels, the latter voltage levels being upper and lower voltage levels of the input signal applied to the input terminal 10. This enables the output terminals 20 and 22 to be connected directly to input terminals of succeeding like stages.

As noted above, the output signal which appears at the output terminal 20 has substantially the same voltage levels as the input signal applied to the input terminal 10, and the transitions in the output signal at the output terminal 20 are in the same direction as the transitions of the input signal. The output signal appearing at the output terminal 22 has substantially the same voltage levels as the input signal, but it is the inverse, or complement, of the input signal and of the output signal at the output terminal 20.

In addition to providing the above-mentioned translation of the voltage levels of the output signals, the emitter followers 42 and 44 also serve to minimize the output impedance of the circuit of FIGURE 1. Therefore, the time constants of any coupling capacitors associated with the outputs of the circuit are materially reduced. Because of the low output impedance provided by the emitter followers, the circuit of FIGURE 1 has a large fan-out capability. That is, the circuit of FIGURE 1 is capable of driving a large number of logic gates and similar circuits.

The low output impedance of the emitter followers 42 and 44 also reduces to a large extent the effects of parasitic coupling to ground or to the substrate, when the circuitry of FIGURE 1 is constructed as an integrated circuit.

The inclusion of the transistor 34 and its associated circuitry provides voltage regulation in the system of FIGURE 1. The transistor 34 responds to any variations in the source voltage to shift the operating point of the circuit of the transistors 24 and 26. This renders the over-all system relatively insensitive to variations in the power supply voltage.

Figure 2:
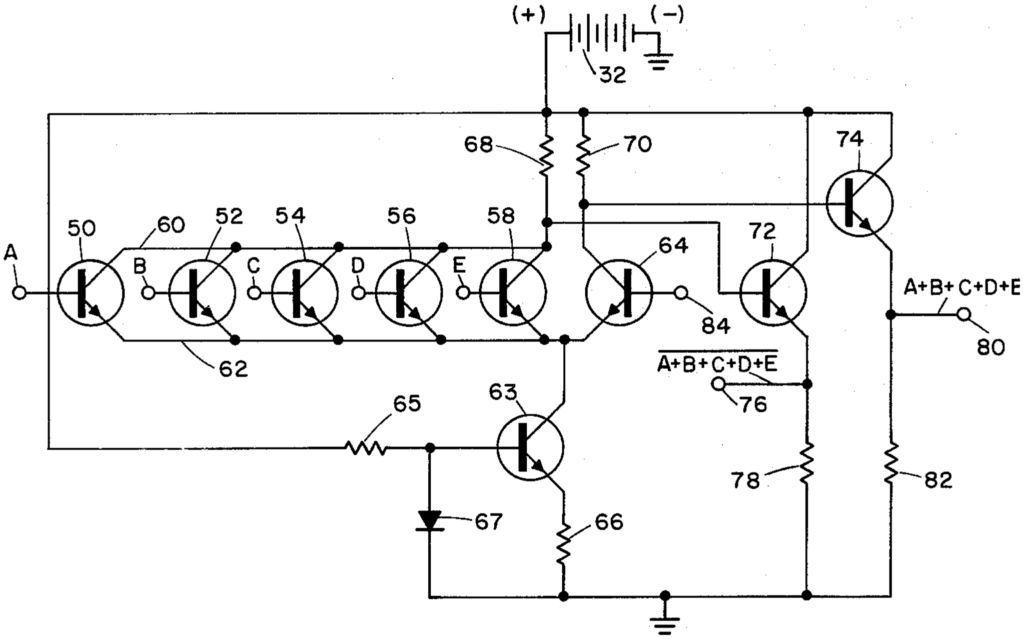
FIGURE 2 is a logic gate involving the switching circuit of FIGURE 1, which also is constructed to incorporate the teachings of the invention and which also is particularly adapted for integrated circuit construction.

The logic gate circuit of FIGURE 2, as mentioned above, incorporates the transistorized current mode switching circuit of FIGURE 1. The logic gate circuit of FIGURE 2 includes a plurality of NPN transistors 50, 52, 54, 56, and 58. Each of these transistors has a collector connected to a common lead 60, and each has an emitter connected to a common lead 62. Input terminals to the gate are designated A, B, C, D, and E, respectively, and these input terminals are connected to respective ones of the base electrodes of the different transistors 50, 52, 54, 56 and 58.

The transistor 58, and an additional NPN transistor 64, are connected as a current mode switching circuit similar to the circuit of FIGURE 1. The emitters of these transistors are connected to the lead 62 which, in turn, is connected to the collector of an NPN transistor 63. The emitter of the transistor 63 is connected to a common resistor 66 which may, for example, have a resistance of 1.24 kilo-ohms and which is connected to ground. The base of the transistor 63 is connected to a resistor 65 and to the anode of a diode 67. The resistor 65 is connected to the positive terminal of the source 32, and the cathode of the diode 67 is grounded.

The collector of the transistor 58 is connected to a resistor 68, and the collector of the transistor 64 is connected to a resistor 70. Each of these resistors is connected to the positive terminal of the source 32, and each may have a resistance, for example, of 300 ohms. The source 32 may have a voltage, for example, of 3.2 volts.

The collector of the transistor 58 is connected to the base of an NPN emitter follower transistor 72, and the collector of the transistor 64 is connected to the base of an NPN emitter follower transistor 74. The collector of the transistor 72 and the collector of the transistor 74 are both connected to the positive terminal of the source 32.

The emitter of the transistor 72 is connected to an output terminal 76 and to a grounded resistor 78. The emitter of the transistor 74 is connected to an output terminal 80 and to a grounded resistor 82. The resistors 78 and 82 may each have a resistance for example, of 2 kilo-ohms.

An appropriate voltage regulating circuit, such as the circuit of the transistor 34 in FIGURE 1, applies a regulated bias voltage to a terminal 84. The terminal 84 is connected to the base of the transistor 64.

The current switching circuit of FIGURE 2 operates in conjunction with the transistors 50, 52, 54, and 56, such that the inputs A, B, C, D and E applied to the correspondingly designated input terminals appear at the output terminal 76 in a "nor", or complemented "or", gate configuration of $\overline{A+B+C+D+E}$; whereas the output appears as an "or" gate output at the output terminal 80, namely as $A+B+C+D+E$.

As in the circuit of FIGURE 1, the emitter follower circuits 72 and 74 serve a twofold purpose in that they translate the direct current level of the outputs so that the outputs are compatible with the voltage level requirement at the various inputs; and secondly since the emitter followers have low output impedance; they provide the gate with large fan-out capabilities, and low leakage to the substrate when an integrated circuit construction is used.

If a positive signal, representing a logical "1" is applied to any of the input terminals A, B, C, D, or E of the circuit of FIGURE 2, the collector of the fixed bias transistor 64 goes positive and the output from the common collector lead 60 goes negative. The two outputs, therefore, perform the logical operations of "or" and "nor", respectively. If on the other hand, a negative signal had been used to represent a logical "1," the basic gate of FIGURE 2 would, of course, perform the logical operations of "and" and "nand".

The fixed bias for the transistor 64 is supplied, as mentioned, by a voltage regulator circuit such as shown in FIGURE 1. The voltage regulator circuit, as described above, compensates for drift in the direct current output level due to variations in the power supply voltage.

As the temperature varies, the output level tends to shift mainly due to changes in the bias between the base and emitter of the emitter followers 72 and 74, since the transfer characteristic of the gate itself is only dependent upon the ratio between the common emitter resistance 66 and the collector resistance 68. This is because of the large amount of degenerative feedback furnished by the common emitter resistor 66. However, since the emitter-base bias voltage of the regulator varies by the same amount as the emitter followers, and since the current drawn by the gate transistors 50, 52, 54, 56, and 58 is proportional to the bias applied to the transistor 64 by the voltage regulator, the regulator circuit exactly counteracts any tendency for a voltage shift at the output.

Similarly, the voltage regulator circuit counteracts shifts in the output direct current level due to power supply variations. This is because changes in the collector voltages of the gate transistors are negatively proportional to the bias voltage applied to the base of the transistor 64 by the voltage regulator, which by virtue of the regulator is proportional to the power supply voltage.

For instance, if for some reason the power supply voltage is lowered, the output of the regulator is correspondingly decreased resulting in less current drawn by the gate transistors which, in turn, increases the direct current level at the common collector lead 60, thus counteracting the power supply change. With the value shown for the resistors in FIGURE 2, for example, power supply variations of ±20% can easily be tolerated by the gate circuit.

The transistor 63 acts as a current generator and serves to compensate for variations in the internal resistance of the switching transistors due to temperature variations. The compensating change in the internal resistance of the transistor 63 serves to maintain the feedback voltage across the resistor 66 constant in the presence of temperature variations.

The diode 67 maintains the voltage applied to the base of the transistor at a relatively low level, and which varies in the desired compensating direction as temperature changes cause corresponding variations in the internal resistance of the diode. The network including transistor 63, resistor 66 and diode 67 is a constant current generator.

In general, the offset voltage of the diode 67 should be larger than the offset voltage of the base-emitter junction of transistor 63. This can be accomplished with a single diode if the transistor 63 is a germanium type and the diode 67 is of silicon or gallium arsenide. If the transistor 63 is a silicon type, the diode 67 can be of gallium arsenide. The magnitude of the collector current of transistor 63 is determined by the difference between the potential dropped across the base-emitter junction of transistor 63 and that dropped across the diode 67. The magnitude of the collector current is the differential voltage just referred to divided by the resistance value of resistor 66.

The operation of the logic gate circuit of FIGURE 2 is inherently very fast, for a number of reasons. Firstly, since most of the logical decisions are performed at the low impedance level of the common emitter load, and since the output impedance of the gate circuit is low, the deteriorating effects of parasitic and low capacitances are minimized. Secondly, the signals passed through the gate circuit of FIGURE 2 are essentially through emitter followers and grounded base stages which are inherently fast. Finally, due to feedback of the common emitter mode with respect to ground, the input capacitance of these gates is small, and since the circuits are intentionally designed to prevent saturation of the transistors, additional delay due to storage time effects is eliminated.

For high speed applications, the fan-out capability of the gate circuit of FIGURE 2, of course, is determined by the capacitive loading of the succeeding stages, rather than direct current considerations. Although the degenerative feedback around the common emitter resistance 66 reduces the input capacity to the gate, and although the output impedance of the gate is very small, the fan-out in high speed applications will, in general, be considerably less than 100.

In regard to noise and cross-talk, the logic gate circuit of FIGURE 2 has several inherent advantages. Firstly, inductive type cross-talk between adjacent signal lines is minimized, since only a small amount of current is transmitted from one circuit to the other due to the high input impedance of the gates. Secondly, cross-talk due to mutual capacitances between inputs is drastically attenuated because of the inherent low output impedance of the gate. Finally, noise generated in the ground lines and power supply lines is practically non-existent since the current demand of the gate is constant and independent of the state of operation of the gate.

Figure 3:
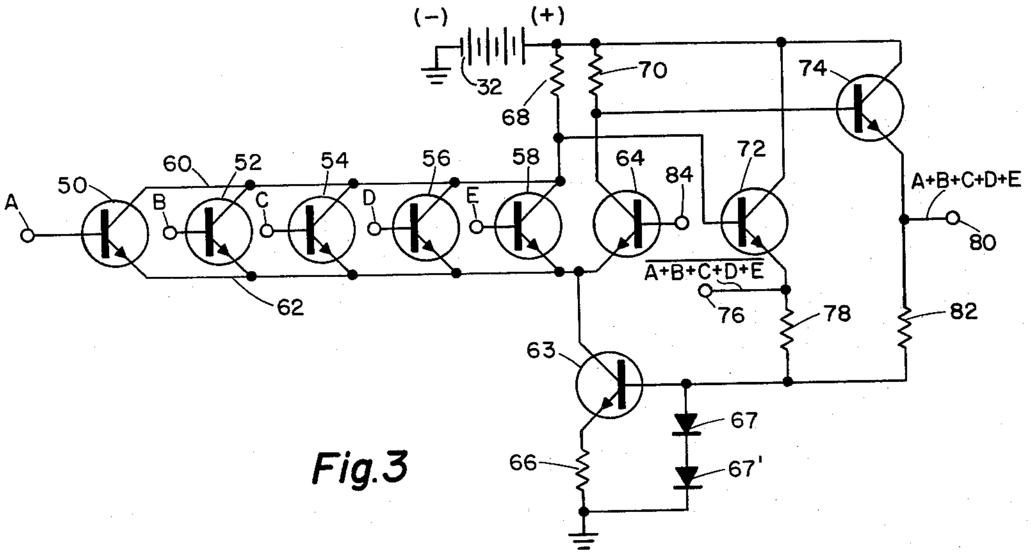
FIGURE 3 is a logic gate which constitutes another embodiment of the invention.

FIGURE 3 illustrates another embodiment of the invention in which the constant current generator is formed by the transistor 63, a resistor 66 and two diodes 67 and 67'. This embodiment is useful in the case where it is desired to use the same material for the transistor 63 and the compensating diodes, such as would be the case where the circuit is built as an integrated circuit in a single semiconductor element. In order to conserve power and minimize the number of components, the two diodes 67 and 67' are fed from the emitter-follower resistors 78 and 82. This makes it possible to eliminate the resistor 65 of FIGURE 2. In FIGURE 3, one unit of offset voltage exists across resistor 66 and the other unit exists across the base-emitter junction of transistor 63. Thus, the collector current of transistor 63 is determined by the unit offset voltage divided by the value of resistor 66.

Since the logic swing is equal to the offset voltage multiplied by the ratio of the resistance values of resistors 68 and 66, and since the offset voltage varies with temperature, the logic swing will also be temperature dependent, normally becoming smaller as temperature increases. Therefore, as temperature increases there is less chance of the gate transistors becoming saturated. Various combinations of temperature coefficients for the resistors as well as temperature characteristics of the diodes 67, 67' and the transistor 63 may be used so as to obtain whatever temperature behavior is desired for the complete circuit.

Figure 4:
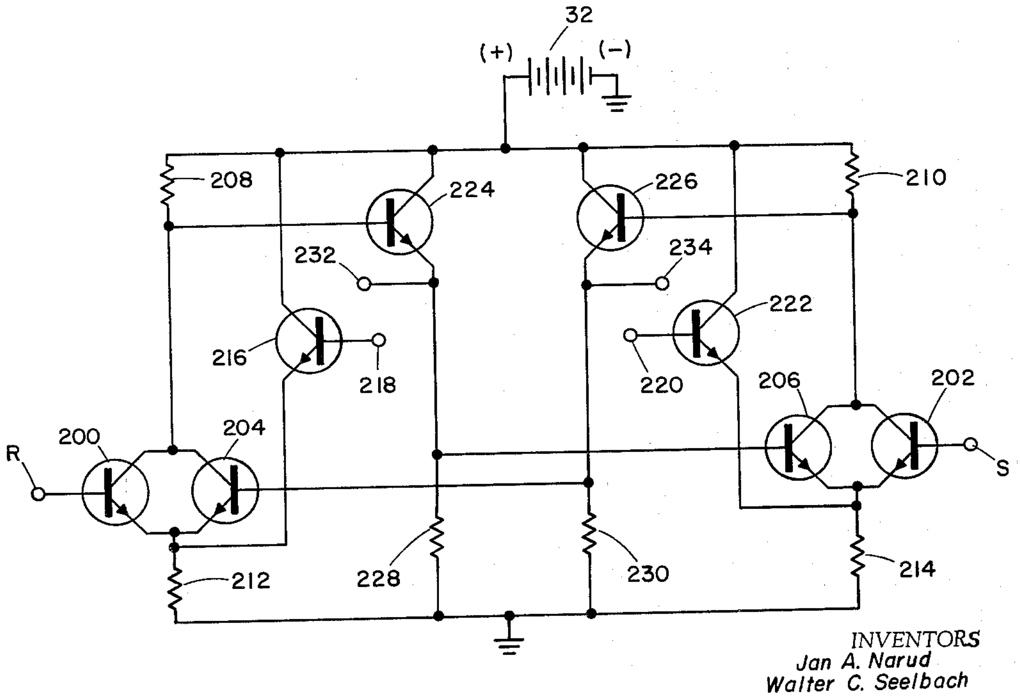
FIGURE 4 is a bi-stable multivibrator flip-flop circuit in accordance with the invention.

A flip-flop version of the logic circuitry of the invention is shown in FIGURE 4. The flip-flop of FIGURE 4 includes an input terminal designated "R" and an input terminal designated "S." The "R" input terminal serves to reset the flip-flop, and the "S" input terminal serves to set the flip-flop.

The "R" input terminal is connected to the base of an NPN transistor 200, and the "S" input terminal is connected to the base of an NPN transistor 202. The emitter and collector of the transistor 200 are respectively connected to the corresponding electrodes of a transistor 204. Likewise, the emitter and collector of the transistor 202 are respectively connected to the corresponding electrodes of a transistor 206.

The common collectors of the transistors 200 and 204 are connected to a resistor 208, and the common collectors of the transistors 202 and 206 are connected to a resistor 210. The resistors 208 and 210 are connected to the positive terminal of the voltage source 32. The common emitters of the transistors 200 and 204 are connected to a grounded resistor 212, and the common emitters of the transistors 202 and 206 are connected to a grounded resistor 214.

An NPN transistor 216 has its emitter connected to the resistor 212, and the collector of the latter transistor is directly coupled to the positive terminal of the source 32. A terminal 218 is connected to the base of the transistor 216, and a circuit, such as the circuit of the transistor 34 in FIGURE 1, supplies a regulated voltage to the terminal 218.

A similar regulated voltage is applied to an input terminal 220 which is connected to the base of a transistor 222. The emitter of the transistor 222 is connected to the resistor 214, and the collector of that transistor is directly connected to the positive terminal of the source 32.

The common collectors of the transistors 200 and 204 are connected to the base of an NPN emitter follower transistor 224. Likewise, the common collectors of the transistors 202 and 206 are connected to the base of an emitter follower transistor 226.

The collectors of the transistors 224 and 226 are connected to the positive terminal of the source 32. The emitters of these transistors are connected to respective grounded resistors 228 and 230, and to respective output terminals 232 and 234. The emitter of the transistors 224 is also connected to the base of the transistor 206, and the emitter of the transistor 226 is also connected to the base of the transistor 204.

It will be appreciated that the flip-flop circuit of FIGURE 4 is formed essentially of two cross-coupled gates. The basic flip-flop circuit performs set and reset operations.

Assume first that the flip-flop is in its set state in which the transistor 204 is non-conductive and the transistor 206 is conductive, and a positive-going reset signal is applied to the input terminal "R."

The resulting conductivity of the transistor 200 causes the voltage across the collector resistor 208 to drop to render the emitter follower transistor 224 non-conductive. This removes the positive bias from the base of the transistor 206 and that transistor becomes non-conductive. This causes the emitter follower transistor 226 to become conductive to produce a positive voltage across the resistor 230. This latter voltage renders the transistor 204 conductive and holds the flip-flop in its reset state until a positive-going set trigger pulse is applied to the input terminal "S."

When the flip-flop is in its reset state, the transistor 204 is conductive and the transistor 206 is non-conductive. A positive-going set pulse applied to the input terminal "S" causes operations complementing those described above to occur, and the flip-flop is triggered back to its reset state.

The direct current characteristics of the flip-flop of FIGURE 3 are the same as the circuits of FIGURES 1 and 2, and the circuit of FIGURE 3 exhibits all the advantages of the previous circuits which render it well suited for integrated circuit construction.

The invention provides, therefore, logic circuitry which is extremely reliable, and which is insensitive to relatively wide variations in component values, parameter changes and power supply drift.

The above-mentioned insensitivity of the circuitry is due to the large amount of feedback furnished by the common emiter resistors in the various circuits, and because the transfer characteristics of the circuitry are not dependent upon the actual values of the resistors involved, but only upon the ratio between the different resistors.

The fan-in, fan-out capabilities of the circuits are inherently large because of the low impedance level of the common emitter, and because of the high input impedance and low output impedance of the circuits.

The logical capabilities of the circuits of the invention are high because they perform the "or" and "nor" functions simultaneously in addition to the large fan-in, fan-out capabilities. Also, a considerable amount of logical flexibility is possible since the "or" functions can be performed either at the common emitters or at the output of the individual circuits. For positive logic, the logical "or" function at the outputs of the gates may be implemented by inter-connecting the inverted outputs of two or more gates which perform the "and" function internally, or by interconnecting the non-inverted outputs of two or more gates which perform an "or" function internally. It has been found that since the logic performs the "or" and "nor" functions simultaneosuly, the inter-connection problem between successive stages can be materially reduced.

The logic circuitry of the invention is extremely fast. That is, the propagation delay is very small, since most of the logical decisions are performed at the low impedance level of the common emitters. Since the signal paths are essentially through emitter followers and grounded base stages, and since the transistors in these circuits never become saturated.

Systems implemented with the logic circuitry of the invention have a high degree of noise immunity because of the input impedance of the circuits is high so that only a small amount of current is transmitted from one circuit to the other; and because the output impedance is low, thereby minimizing cross-talk between adjacent interconnections.

Also, noise signals induced on power supply leads are minimized since the current demand of the circuitry is constant, and independent of the particular state of the circuitry at any particular time. Moreover, since the tolerance requirements of the circuit are not high, and since the circuit is relatively insensitive to parameter changes and parasitics in the circuitry, the manufacturing of units embodying the circuits of the invention is relatively simple.

While particular embodiments of the invention have been shown and described, it is obvious that modifications may be made. The following claims are intended to cover all such modifications as fall within the spirit and scope of the invention.

We claim:

1. A semiconductor device forming an integrated logic circuit and including in combination, first and second sections each having first, second, third and fourth transistors, each of said transistors having an emitter, a collector and a base electrode, first and second conductors adapted to receive a direct current potential therebetween, first means coupling said collector electrode of said first transistor to said first conductor, second resistance means connected to said collector electrodes of said second and third transistors and coupling the same to said first conductor, impedance means connected to said emitter electrodes of said first second and third transistors and coupling the same to said second conductor, bias circuit means coupled to said base electrode of said first transistor for introducing a predetermined bias potential thereto to establishe the switching level for said first and second transistors, said base electrode of said second transistor being responsive to an input signal to switch the circuit between a first state in which one of said first and second transistors is conductive and a second state in which the other of said first and second transistors is conductive, emitter follower circuit means including said fourth transistor and means connecting said collector electrode of said fourth transistor to said first conductor and including resistor means connecting said emitter electrode of said fourth transistor to said second conductor, and means connecting said base electrode of said fourth transistor to said collector electrode of one of said first and second transistors, and means cross-connecting said first and second sections of said logic circuit including means connecting said emitter electrode of said fourth transistor of said first section to said base electrode of said third transistor of said second section, and means connecting said emitter electrode of said fourth transistor of said second section to said base electrode of said third transistor of said first section.

2. A semiconductor device in accordance with claim 1 wherein all of said transistors are of the same conductivity type, and wherein said base electrode of said fourth transistor of each section is connected to said collector electrode of said second transistor thereof.

3. A logic circuit constructed in integrated circuit form and responsive to a binary logic input signal having first and second voltage levels with respect to a reference potential, such logic circuit including in combination: a first transistor and a plurality of second transistors of the same conductivity type each including an emitter, a collector and a base electrode, said emitter electrodes and said collector electrodes of said second transistors being connected together respectively; means for connection to a power supply and including a first conductor at the reference potential and a second conductor providing a direct current potential with respect to said reference potenial; first resistance means connected between said collector electrode of said first transistor and said second conductor and forming the sole potential supply to said collector electrode, second resistance means connected between said collector electrodes of said second transistors and said second conductor and forming the sole potential supply to said collector electrodes, and third resistance means connected between said first conductor and said emitter electrodes of said first and second transistors; bias circuit means coupled to said base electrode of said first transistor for establishing thereat a predetermined bias potential having a voltage with respect to said reference potential intermediate said first and second voltage levels; input circuit means including an input portion coupled to said base electrode of each of said second transistors for applying thereto binary logic input signals to switch the circuit between a first state in which said first transistor is conductive and a second state in which one of said second transistors is conductive, said levels of said input signals and said bias potential having values such that said first and second transistors when conductive are in a non-saturated condition; and output circuit means including third and fourth transistors of the same conductivity type as said first and second transistors, each of said third and fourth transistors being connected in an emitter follower circuit and having a collector electrode connected to said second conductor, a base electrode and an emitter electrode, said base electrode of said third transistor being conductively connected to said collector electrode of said first transistor and said base electrode of said fourth transistor being conductively connected to said collector electrodes of all of said second transistors, and fourth and fifth resistance means connected respectively between said emitter electrodes of said third and fourth transistors and said first conductor; and first and second output terminals connected respectively to said emitter electrodes of said third and fourth transistors for providing binary logic output signals, the base to emitter junctions of said third and fourth transistors each translating the voltage levels of the signal at the base electrode so that said binary output signals have voltage levels substantially the same as the levels of the binary input signal.

4. A logic circuit in accordance with claim 3 wherein said transistors are all of the NPN type.

5. A logic circuit in accordance with claim 3 wherein said third resistance means includes a further transistor having base, emitter and collector electrodes, and a resistor connected in series with the emitter to collecor path of said further transistor between said emitter electrodes of said first and second transistors and said first conductor, and circuit means including temperature compensating means connected to said first and second conductors and to said base electrode of said further transistor for applying a bias potential thereto.

6. A logic circuit constructed in integrated circuit form and responsive to a binary logic input signal having first and second voltage levels with respect to a reference potential, such logic circuit including in combination: first and second transistors of the same conductivity type each including an emitter, a collector and a base electrode; means for connection to a power supply and including a first conductor at the reference potential and a second conductor providing a direct current potential with respect to said reference potenial; first and second resistance means connected respectively between said collector electrodes of said first and second transistors and said second conductor and forming the sole potential supply to said collector electrodes; third resistance means coupled between said first conductor and said emitter electrodes of said first and second transistors; bias circuit means coupled to said base electrode of said first transistor for establishing thereat a predetermined bias potential having a voltage with respect to said reference potential intermediate said first and second voltage levels, said bias circuit means including voltage divider resistance means connected between said first and second conductors and having temperature compensating means, a third transistor having a base electrode connected to an intermediate point on said voltage divider resistance means, a collector electrode connected to said second conductor and an emitter electrode, fourth resistance means connecting said emitter electrode of said third transistor to said first conductor, and means connecting said emitter electrode of said third transistor to said base electrode of said first transistor; input circuit means coupled to said base electrode of said second transistor for applying thereto the binary logic input signal to switch the circuit between a first state in which one of said first and second transistors is conductive and a second state in which the other of said transistors is conductive; and output circuit means including fourth and fifth transistors of the same conductivity type as said first and second transistors, each of said fourth and fifth transistors being connected in an emitter follower circuit and having a collector electrode connected to said second conductor, a base electrode conductively connected to said collector electrode of said first and second transistors respectively and an emitter electrode, and fifth and sixth resistance means connected respectively between said emitter electrodes of said fourth and fifth transistors and said first conductor; and first and second output terminals connected respectively to said fifth and sixth resistance means for providing binary logic output signals, the base to emitter junction of said fourth and fifth transistors each translating the voltage levels of the signal at the collector electrode of the associated one of said first and second transistors so that said binary output signals have voltage levels substantially the same as the levels of the binary output signal.

7. A logic circuit in accordance with claim 6 wherein said third transistor is of the same type as said first transistor and applies a bias potential to said base electrode of said first transistor equal to $V_C - V_{L/2} - V_T$, where $V_C$ is the value of the direct current potential between said first and second conductors, $V_L$ is the logic swing between the first and second voltage levels of the input signal, and $V_T$ is the offset voltage of the transistors.

References Cited by the Examiner

UNITED STATES PATENTS

| | | | |
|---|---|---|---|
| Re. 23,770 | 1/1954 | Bergfors | 328—200 |
| 2,440,992 | 5/1948 | Webb | 328—213 |
| 2,658,167 | 11/1953 | Harris | 328—148 |
| 2,698,416 | 12/1954 | Sherr | 307—88.5 |
| 2,779,872 | 1/1957 | Patterson | 328—127 |
| 2,972,117 | 2/1961 | Jarmotz et al. | 328—203 X |
| 2,975,260 | 3/1961 | Carlson | 307—88.5 |
| 2,984,753 | 5/1961 | DellaSalle | 307—88.5 |
| 3,051,848 | 8/1962 | Clark | 307—88.5 |
| 3,054,910 | 9/1962 | Bothwell | 307—88.5 |
| 3,058,007 | 10/1962 | Lynch | 307—88.5 |
| 3,080,531 | 3/1963 | Koppel et al. | 330—69 |
| 3,200,258 | 8/1965 | Carroll | 307—88.5 |

OTHER REFERENCES

"Selected Semiconductor Circuit Handbook," by Schwartz, John Wiley and Son, Inc., New York, page 6–43 and 6–44.

ARTHUR GAUSS, *Primary Examiner.*

B. P. DAVIS, *Assistant Examiner.*